United States Patent [19]
Cochran et al.

[11] Patent Number: 6,154,510
[45] Date of Patent: Nov. 28, 2000

[54] SYMBOL TIMING RECOVERY BASED ON ADJUSTED, PHASE-SELECTED MAGNITUDE VALUES

[75] Inventors: Bruce A. Cochran; Ronald D. McCallister, both of Scottsdale, Ariz.

[73] Assignee: Sicom, Inc., Scottsdale, Ariz.

[21] Appl. No.: 09/303,845

[22] Filed: May 3, 1999

[51] Int. Cl.[7] .................................................. H04L 7/00
[52] U.S. Cl. ...................... 375/371; 375/326; 327/141; 327/147
[58] Field of Search .................... 375/371, 226, 375/326, 327, 354, 355; 329/300, 304; 327/141, 147

[56] References Cited

U.S. PATENT DOCUMENTS

| | | | |
|---|---|---|---|
| 4,215,239 | 7/1980 | Gordy et al. | 375/114 |
| 5,440,265 | 8/1995 | Cochran et al. | 329/300 |
| 5,671,257 | 9/1997 | Cochran et al. | 375/355 |
| 5,764,102 | 6/1998 | Cochran et al. | 329/304 |
| 5,862,191 | 1/1999 | Moridi | 375/355 |

OTHER PUBLICATIONS

Lars Erup, et al., "Interpolation in Digital Modems–Part II: Implementation and Performance", IEEE Transactions on Communications, vol.–41, No. 6, Jun. 1993, pp 998–1007.

K. Bucket et al., "Symbol Synchronizer Performance Affected by Non–Ideal Interpolation in Digital Modems" 1994, IEEE, pp 929–933.

Primary Examiner—Stephen Chin
Assistant Examiner—Mohammad Ghayour
Attorney, Agent, or Firm—Meschkow & Gresham P.L.C.; Jordan M. Meschkow; Lowell W. Gresham

[57] ABSTRACT

A digital communication receiver (10) includes a magnitude-based symbol synchronizer (38) which separates complex phase attributes from magnitude attributes. The phase attributes are processed by a phase processor (78) which identifies clock adjustment opportunities. The magnitude attributes are processed by a magnitude processor (76) that generates a phase error estimate signal (82), which in turn drives a clock generator (24) in a phase locked loop (54) to achieve symbol synchronization in a non-data-directed manner. An additional adjustment feedback loop (114, 128) includes a phase error offset generator (52) and operates in conjunction with the phase locked loop (54) to allow the phase locked loop (54) to achieve lock and a robust operating point in spite of distortion in a received input analog signal (12).

20 Claims, 5 Drawing Sheets

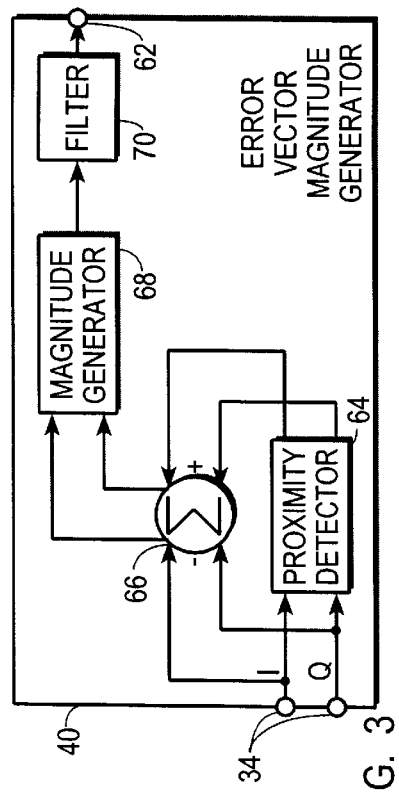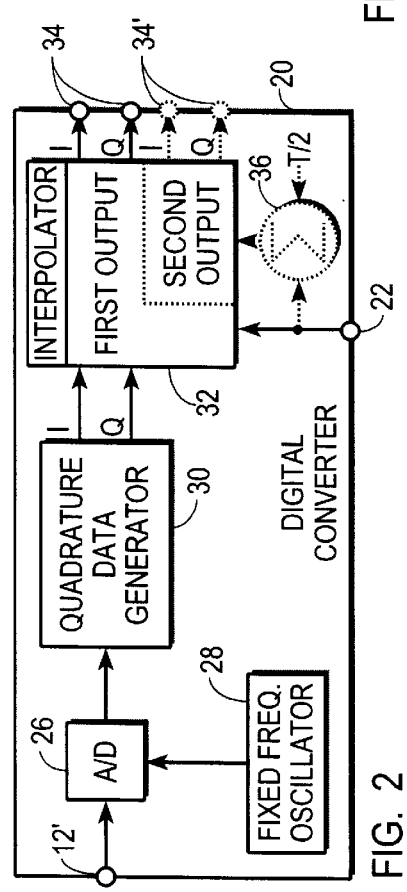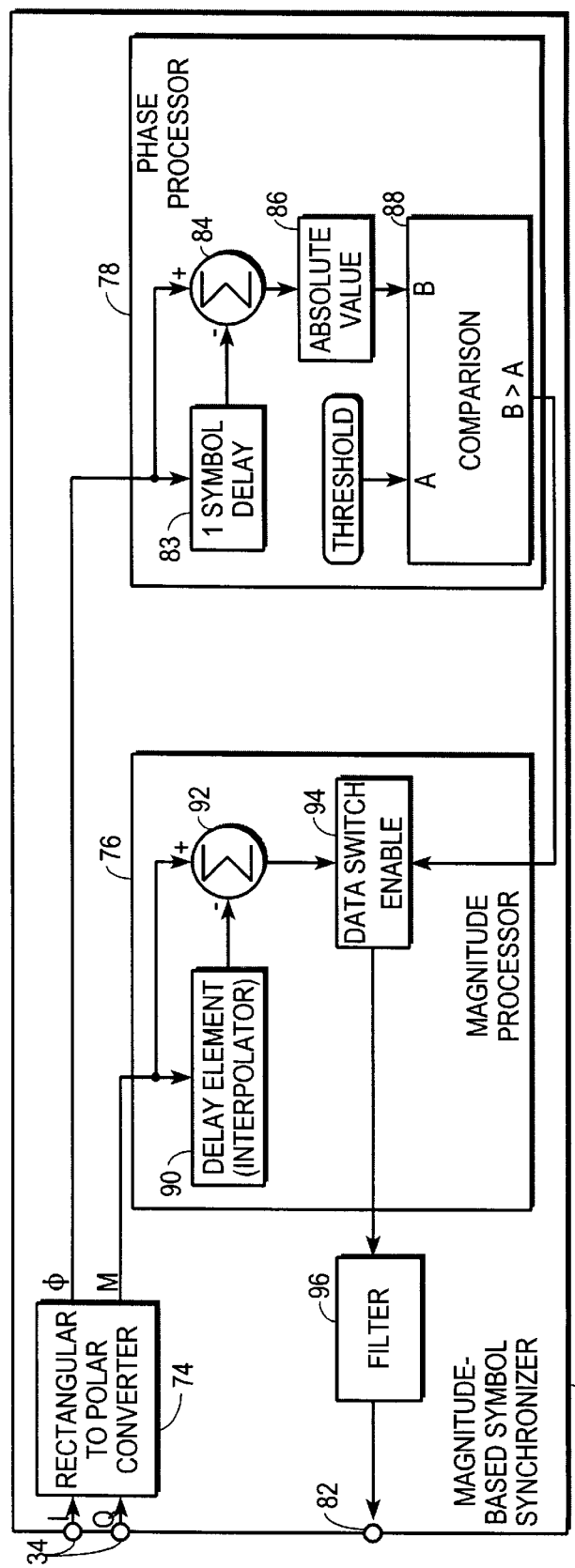

SYMBOL TIMING RECOVERY BASED ON ADJUSTED, PHASE-SELECTED MAGNITUDE VALUES

RELATED PATENTS

The present patent is related to "*Symbol Timing Recovery Based On Complex Sample Magnitude*" by Bruce A. Cochran and Ronald D. McCallister, U.S. Pat. No. 5,671,257, issued Sep. 23, 1997, which is incorporated herein by reference.

TECHNICAL FIELD OF THE INVENTION

The present invention relates generally to the field of digital communications. Specifically, the present invention relates to synchronizing digital receivers to symbol timing. More specifically, the present invention relates to recovering symbol timing based upon the magnitude attribute of selected complex samples of an input data stream that exhibits distortion.

BACKGROUND OF THE INVENTION

Symbol synchronization in a digital communication receiver refers to identifying the instants in time at which samples of an input communication signal are best obtained to recover data conveyed by the input communication signal. Only one sample is needed per symbol interval to accurately recover communicated data. A symbol interval, also called a unit interval or simply a symbol, is a discrete duration within which a received signal conveys a unit of data. The unit of data may include one or more bits. The process of symbol synchronization determines the best instant within each symbol interval at which to obtain a sample that will be relied upon in the recovery of the unit of data.

A few prior digital receivers have achieved symbol synchronization using only one complex sample per symbol interval. However, such digital receivers have been extremely sensitive to carrier synchronization and frequency offsets, such as those caused by Doppler. The majority of prior digital receivers achieves symbol synchronization using two or more complex samples per symbol interval. The use of two or more complex samples per symbol interval is highly undesirable because it requires the use of high speed components and/or the use of excessively complex parallel circuits.

U.S. Pat. No. 5,671,257, assigned to the assignee of the present invention, teaches a magnitude-based symbol synchronizer that achieves symbol synchronization using as few as one complex sample per symbol interval. This magnitude-based symbol synchronizer works well for many applications without modification. However, when the received communication signal has experienced significant distortion, e.g. excessive multipath, the magnitude-based symbol synchronizer of U.S. Pat. No. 5,671,257 may upon occasion unreliably track symbol timing of the received signal, and may even fail to lock to the symbol timing in extreme situations.

Accordingly, a need exists for a symbol synchronizer that performs robustly, even in the presence of significant received signal distortion.

SUMMARY OF THE INVENTION

Accordingly, it is an advantage of the present invention that an improved symbol synchronizer and method are provided which recover symbol timing based on adjusted, phase-selected magnitude values.

Another advantage is that the present invention exhibits robust performance even in the presence of significant received signal distortion.

Another advantage is that the present invention may be used with fewer than two samples per symbol.

Another advantage is that the present invention includes a non-data-directed symbol synchronization process, which does not require a-priori recovery of valid data.

The above and other advantages of the present invention are carried out in one form by a symbol synchronizer for recovering symbol timing in a digital communication receiver which receives an analog signal configured as a stream of symbols from a channel which distorts the analog signal. The symbol synchronizer includes a clock generator that generates a clock signal which defines symbol timing. A converter for converting the analog signal into a complex digital data stream having a complex sample for each symbol interval couples to the clock generator. A phase processor that identifies clock adjustment opportunities in response to phase relationships exhibited by the complex samples couples to the converter. A magnitude processor generates a phase error estimate signal that adjusts the symbol timing defined by the clock signal in response to magnitude relationships exhibited by the complex samples. The magnitude processor couples to the converter, the phase processor and the clock generator and updates the phase error estimate signal in synchronism with the identified clock adjustment opportunities. A phase error offset generator adjusts the phase error estimate signal to cause a phase locked loop which includes the clock generator, the converter and the magnitude processor to achieve a locked condition in the presence of distortion in the analog signal. The phase error offset generator couples to the magnitude processor.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 2 shows a block diagram of a digital converter portion of the digital communication receiver;

FIG. 3 shows a block diagram of an error vector magnitude generator portion of the digital communication receiver;

FIG. 4 shows a block diagram of a magnitude-based symbol synchronizer portion of the digital communication receiver;

DETAILED DESCRIPTION OF THE PREFERRED EMBODIMENTS

Figure 1:
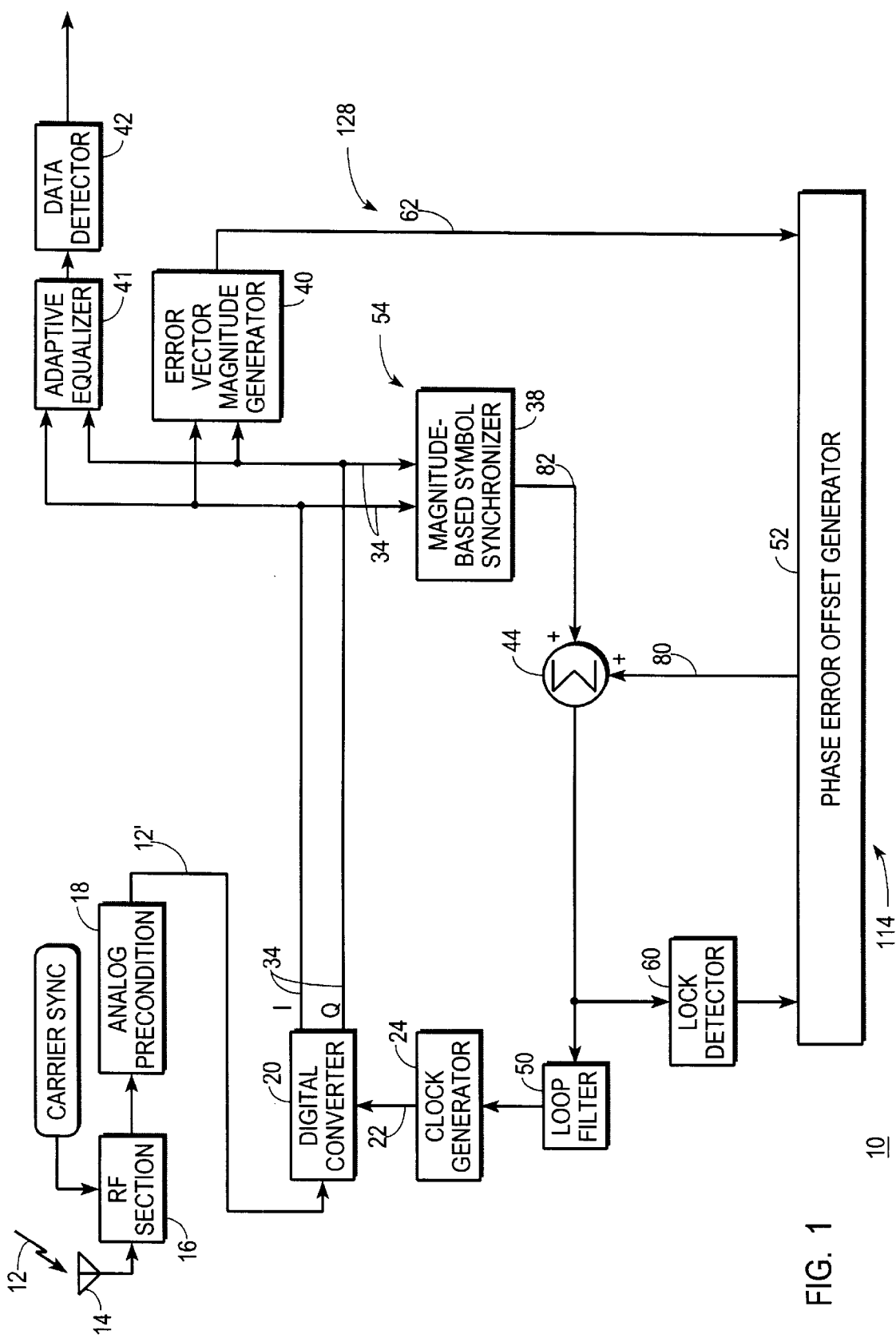
FIG. 1 shows a block diagram of a preferred digital communication receiver configured in accordance with the present invention.

FIG. 1 shows a block diagram of a digital communication receiver 10 configured in accordance with a preferred embodiment of the present invention. Receiver 10 recovers digital data from an incoming analog carrier signal 12, which is an RF signal in the preferred embodiment. Carrier signal 12 is configured as a stream of discrete symbol intervals. The symbol intervals are of equivalent duration, and each symbol interval conveys a unit of data. A unit of data conveys one or more bits. Signal 12 is modulated using some form of constant or non-constant-envelope modulation.

Signal 12 is received at an antenna 14. Antenna 14 couples to an RF section 16. RF section 16 may include RF filtering, a fixed frequency oscillator, a variable frequency oscillator, down-conversion circuits, and other components conventionally included in RF sections of radio receivers. RF section 16 preferably generates an essentially baseband, analog form of signal 12. A control input of RF circuit 16 receives a carrier synchronization control signal from a phase locked loop circuit (not shown). This control signal may be generated in a conventional manner in response to data detected by receiver 10. An output of RF section 16 couples to an input of an analog precondition circuit 18. Circuit 18 includes anti-aliasing filtering, automatic gain control (AGC), and other circuits commonly used to condition an analog signal for digitizing. An output of precondition circuit 18 provides analog signal 12' and couples to an input of a digital converter 20. In the figures, reference numbers pointing to interconnections between block diagram boxes, such as reference number 12', refer to signals present at such interconnections. Digital converter 20 digitizes analog signal 12' into at least one stream of complex samples. Each stream of complex samples may include as few as one complex sample per symbol interval and desirably includes less than two complex samples per symbol interval. The symbol timing of the complex samples is defined by a clock signal 22 generated by a clock generator 24.

FIG. 2 shows a block diagram of digital converter 20 as implemented in preferred embodiments of the present invention. In these preferred embodiments, receiver 10 incorporates a fully digital symbol synchronization loop. Accordingly, a signal input of an analog-to-digital (A/D) converter 26 is adapted to receive baseband analog signal 12'. A/D converter 26 digitizes analog signal 12' into samples which characterize its amplitude at various sampling instants defined by a clock signal provided by a fixed frequency oscillator 28. The frequency of this clock signal is desirably greater than the symbol rate but less than two times the symbol rate. In other words, A/D 26 takes more than one complex sample per symbol interval. Those skilled in the art will appreciate that a complex sample may include two measurements taken 90 degrees out of phase with each other.

An output of A/D converter 26 couples to a quadrature data generator 30. Quadrature data generator 30 converts the digital samples of signal 12' into digital rectangular coordinate characterizations of the signal's real or in-phase (I) and imaginary or quadrature (Q) orthogonal components. The preferred embodiment uses a well-known Hilbert transformation technique to convert sampled carrier data pairs into I and Q data values, but other techniques known to those skilled in the art may be used as well. These I and Q data values express I and Q quadrature components in accordance with a rectangular coordinate system. In the preferred embodiment, quadrature data generator 30 produces more than one but desirably less than two complex samples, each of which includes I and Q data values, for each symbol.

The I and Q outputs of quadrature data generator 30 couple to a complex interpolator 32. Clock signal 22, which defines symbol timing as discussed above in connection with FIG. 1, couples to a control input for a first output of interpolator 32. Interpolator 32 provides complex baseband data stream 34 at a first output thereof. Interpolator 32 may be constructed using Farrow, Vesma or other architectures known to those skilled in the art.

As indicated by dotted lines in FIG. 2, interpolator 32 may include an optional second output. In accordance with this option, clock signal 22 is offset in an adder circuit 36 by a constant value before being applied to a control input for the second output of interpolator 32. The optional second output provides a complex baseband data stream 34'. Only the first output of interpolator 32 is used in a first embodiment of receiver 10, described herein primarily in connection with FIG. 1. Both the first and second outputs of interpolator 32 are used in a second embodiment of receiver 10, described herein primarily in connection with FIG. 7. The second output provides a stream of complex samples which are delayed approximately one-half a symbol interval from the samples provided by the first output. Those skilled in the art will appreciate that only an output section of interpolator 32 needs to be provided in duplicate when interpolator 32 has both first and second outputs.

In general, in this fully digital symbol synchronization loop the values of samples are adjusted by interpolation rather than adjusting the timing of samples. Clock signal 22 is a digital data stream that identifies phase values to which interpolator 32 interpolates the quadrature data it receives. Accordingly, clock generator 24 (FIG. 1) is implemented as a numerically controlled oscillator (NCO) which outputs this data stream of phase values.

However, an alternate embodiment of the present invention implements an analog/digital symbol synchronization loop in which an analog voltage controlled oscillator (VCO) provides a clock signal that defines sampling instants for an A/D converter. An example of such an alternate embodiment is provided in the above-listed patent incorporated herein by reference.

Referring back to FIG. 1, baseband data stream 34 is routed to inputs of a magnitude-based symbol synchronizer 38, an error vector magnitude generator 40, and an adaptive equalizer 41. A data detector 42 couples to an output of adaptive equalizer 41. While FIG. 1 shows magnitude-based symbol synchronizer 38, error vector magnitude generator 40, adaptive equalizer 41, and data detector 42 as separate circuit blocks for clarity, those skilled in the art will appreciate that they may share some common circuits in various applications.

An output of magnitude-based symbol synchronizer 38 couples to an first input of a summing circuit 44. An output of summing circuit 44 couples to an input of a loop filter 50. An output of loop filter 50 is coupled to an input of clock generator 24. A phase locked loop (PLL) 54 is formed, and PLL 54 includes digital converter 20, magnitude-based symbol synchronizer 38, summing circuit 44, loop filter 50, and clock generator 24.

Once symbol timing is acquired through the operation of phase locked loop 54, data detector 42 is desirably able to produce usable data. Data detector 42 recovers the data conveyed by signal 12 in a conventional manner. Data detector 42 may include convolutional decoding, de-interleaving, block decoding, and other coding techniques known to those skilled in the art.

Receiver 10 also includes a lock detector 60 having an input coupled to the input of loop filter 50 and an output coupled to a phase error offset generator 52. In an alternate embodiment, the input of lock detector 60 may couple to the output of loop filter 50. Lock detector 60 determines whether PLL 54 is in a locked condition and may include some filtering as well. Those skilled in the art will understand that lock detection can be accomplished by determining when the phase indicated by the phase error estimate signal at loop filter 50 is stable and exhibits an absolute value less than a predetermined threshold. The output of lock detector 60 informs phase error offset generator 52 whether PLL 54 is in a locked condition.

Phase error offset generator 52 generates an adjusting signal 80 that is fed to a second input of summing circuit 44. In addition, an error vector magnitude signal 62 produced by error vector magnitude generator 40 is supplied to an input of phase error offset generator 52. FIG. 3 shows a block diagram of an exemplary error vector magnitude generator 40. Referring to FIG. 3, baseband data stream 34 is routed to I and Q inputs of a proximity detector 64 and a quadrature differencing unit (i.e., a subtractor) 66. Proximity detector 64 has outputs coupled to opposing polarity inputs of quadrature differencing unit 66.

Proximity detectors 64 generate nearest "standard" phase points. Standard phase points are understood to those skilled in the art to represent the quadrature relationships impressed upon a modulated signal in a transmitter (not shown) that transmitted analog signal 12 (FIG. 1). A set of such standard values is often represented as a phase constellation. For sixteen-QAM modulation, for example, the phase constellation includes sixteen standard phase points. The nearest standard phase point is the phase point from a constellation of phase points that is closest to an actual received complex value. Proximity detector 64 is similar in implementation to a data detector, such as data detector 42 (FIG. 1) but need not contain all of the circuitry that a normal data detector contains.

The difference between an actual value and a nearest standard phase point provided by differencing circuit 66 represents an error vector. Quadrature outputs of differencing circuit 66 couple to inputs of a magnitude generator 68. Magnitude generator 68 is configured to provide absolute scalar magnitude values for the error vectors received from differencing circuit 66. These scalar magnitude values are then filtered in a filter 70, which provides error vector magnitude signal 62.

FIG. 4 shows a block diagram of magnitude-based symbol synchronizer 38. Symbol synchronizer 38 includes a rectangular-to-polar converter 74 having inputs adapted to receive complex baseband data stream 34. Symbol synchronizer 38 also includes a magnitude processor 76 and a phase processor 78. Magnitude processor 76 is configured to adjust symbol timing so that the complex sample provided for each symbol interval at the output of adaptive equalizer 41 (FIG. 1) represents analog signal 12 at a desirable point within each symbol interval.

Within symbol synchronizer 38, rectangular-to-polar converter 74 generates phase angle ($\phi$) and magnitude (M) attribute values which correspond to phase relationships expressed between the I and Q quadrature values of complex baseband data stream 34. In other words, converter 74 separates phase attributes of complex baseband data stream 34 from magnitude attributes of stream 34. In the preferred embodiment, a Cordic conversion process is used in separating phase attributes of complex samples from magnitude attributes, but those skilled in the art can adapt other techniques, such as table look-ups and the like, in particular applications.

A phase output of converter 74 couples to phase processor 78. Phase processor 78 processes phase values part from magnitude values to aid in recovering symbol timing. A magnitude output of converter 74 couples to magnitude processor 76. Magnitude processor 76 processes magnitude values to aid in recovering symbol timing. In particular, magnitude processor 76 receives an enabling or synchronizing input from phase processor 78. This enabling or synchronizing input identifies when to allow magnitude attribute data to influence adjustments made to symbol timing. An output from magnitude processor 76 generates a phase error estimate signal 82, that is routed to summing circuit 44 (FIG. 1) to allow symbol synchronizer 38 to control clock generator 24.

Generally, phase processor 78 determines when the track of the signal described by complex baseband data stream 34 transitions to convey data over greater than a predetermined phase angle between symbol intervals. In the preferred embodiment this occurs when the phase angle is greater than approximately 135°. Such transitions are defined as clock adjustment opportunities because the magnitude attribute, when separated from phase influences, tends to behave in a manner that identifies desirable instances within symbol intervals for which samples should be provided for beneficial use in recovering data. Phase transitions less than this predetermined angle are defined as not being clock adjustment opportunities because the magnitude attribute over such transitions does not behave in a manner that identifies desirable instances within symbol intervals for which samples should be provided. In fact, during phase transitions that are defined as not being clock adjustment opportunities, the magnitude attribute may behave somewhat in a manner opposite to that described above.

More specifically, phase processor 78 evaluates phase attributes to distinguish symbol intervals which are clock adjustment opportunities from symbol intervals which are not clock adjustment opportunities. However, phase processor 78 operates upon differential phase, which is relatively insensitive to frequency offsets. In particular, phase values for each symbol interval are supplied to a one symbol delay element 83 and to a positive input of a subtractor 84. An output of delay element 82 couples to a negative input of subtractor 84. An output of subtractor 84 couples to an absolute value element 86, and an output of absolute value element 86 couples to a "B" input of a comparison element 88. A constant threshold value is applied at an "A" input of comparison element 88. An output of comparison element 88 activates when a phase change value at the "B" input is greater than the threshold value at the "A" input. This output couples to magnitude processor 76.

At a current instant, delay element 83 provides a phase value which was valid for a past instant. In particular, the past instant is one symbol delayed from the current instant. Thus, subtractor 84 determines changes in phase attributes between consecutive symbols. These changes are relatively insensitive to frequency offsets because any frequency offset occurring over an interval of only a single symbol typically causes only a minor phase error. Absolute value element 86 strips away positive or negative sign information so that raw phase change data are provided to comparison element 88.

Phase processor 78 identifies clock adjustment opportunities in response to phase changes. Larger amounts of phase change occurring in a given unit of time (i.e. one symbol delay) are defined to be clock adjustment opportunities while smaller amounts of phase change are defined not to be clock adjustment opportunities. The threshold value supplied to the "A" input of comparison element 88 sets the threshold which defines the difference between clock adjustment opportunities and "not" clock adjustment opportunities. The precise value for this threshold is not a critical parameter in the present invention. Acceptable results appear to be obtainable as long as the threshold is set greater than 45°, with even better results obtained when the threshold is set to greater than 180°.

In general, the magnitude attribute that identifies desirable instances within symbol intervals for which samples should be provided is the difference between the magnitude attribute itself and a reconstructed estimate of the magnitude attribute occurring a sub-interval duration later. In the preferred embodiment, that sub-interval duration is approximately one-half of a symbol interval, as determined by an interpolator constructed using, for example, a Farrow interpolator.

More particularly, magnitude processor 76 includes a delay element 90 and a subtractor 92. A positive input of subtractor 92 and an input of delay element 90 each receive magnitude attributes of the complex baseband data for each symbol interval. An output of delay element 90 couples to a negative input of subtractor 92. An output of subtractor 92 couples to a data input of a data switch 94. The enabling or synchronizing signal provided by comparison element 88 of phase processor 78 is routed to an enable input of data switch 94, and an output of data switch 94 serves as the output of magnitude processor 76 and couples to a first input of a filter 96. An output of filter 96 serves as the output from symbol synchronizer 38 and provides phase error estimate signal 82. The total loop filtering for phase locked loop 54 (FIG. 1) is primarily applied collectively by filter 96 and loop filter 50 (FIG. 1). The fractions of this total filtering which is distributed between filter 96 and loop filter 50 are not critical parameters of the present invention.

For each current instant, delay element 90 produces an estimate of the value exhibited by the magnitude attribute signal at a past instant. In the preferred embodiments, delay element 90 is an interpolator which has a fixed delay of one-half the symbol interval. Interpolator 90 need not precisely estimate a delayed version of the magnitude attribute signal.

Subtractor 92 detects changes occurring in magnitude attributes over at least portions of symbols. This magnitude change between the estimated delayed magnitude and the current magnitude is fed through data switch 94 when enabled by phase processor 78. As discussed above, phase processor 78 enables data switch 92 during clock adjustment opportunities. Accordingly, phase error estimate signal 82 generated by magnitude processor 76 is updated in synchronism with the clock adjustment opportunities. Through the filtering of filter 96 and the disabling of switch 94, magnitude changes occurring while not a clock adjustment opportunity have substantially no influence over symbol timing.

Referring to FIGS. 1 and 4, the magnitude change data occurring during clock adjustment opportunities are used in PLL 54 to adjust symbol timing. In particular, polarities are arranged so that decreasing magnitude changes urge clock generator 24 to delay the symbol interval instance for which a complex sample is provided. Likewise, increasing magnitude changes urge clock generator 24 to advance the symbol interval instance for which a complex sample is provided. Due to filtering in PLL 54, the results from any single symbol interval have only a minor influence over symbol timing and general trends detected by magnitude processor 76 are used to control symbol timing. Nevertheless, the loop response of PLL 54 is faster than the response time of an adjustment loop, discussed below.

Additional details concerning the general operation of symbol synchronizer 38 may be found in the above-listed patent incorporated herein by reference.

Figure 5:
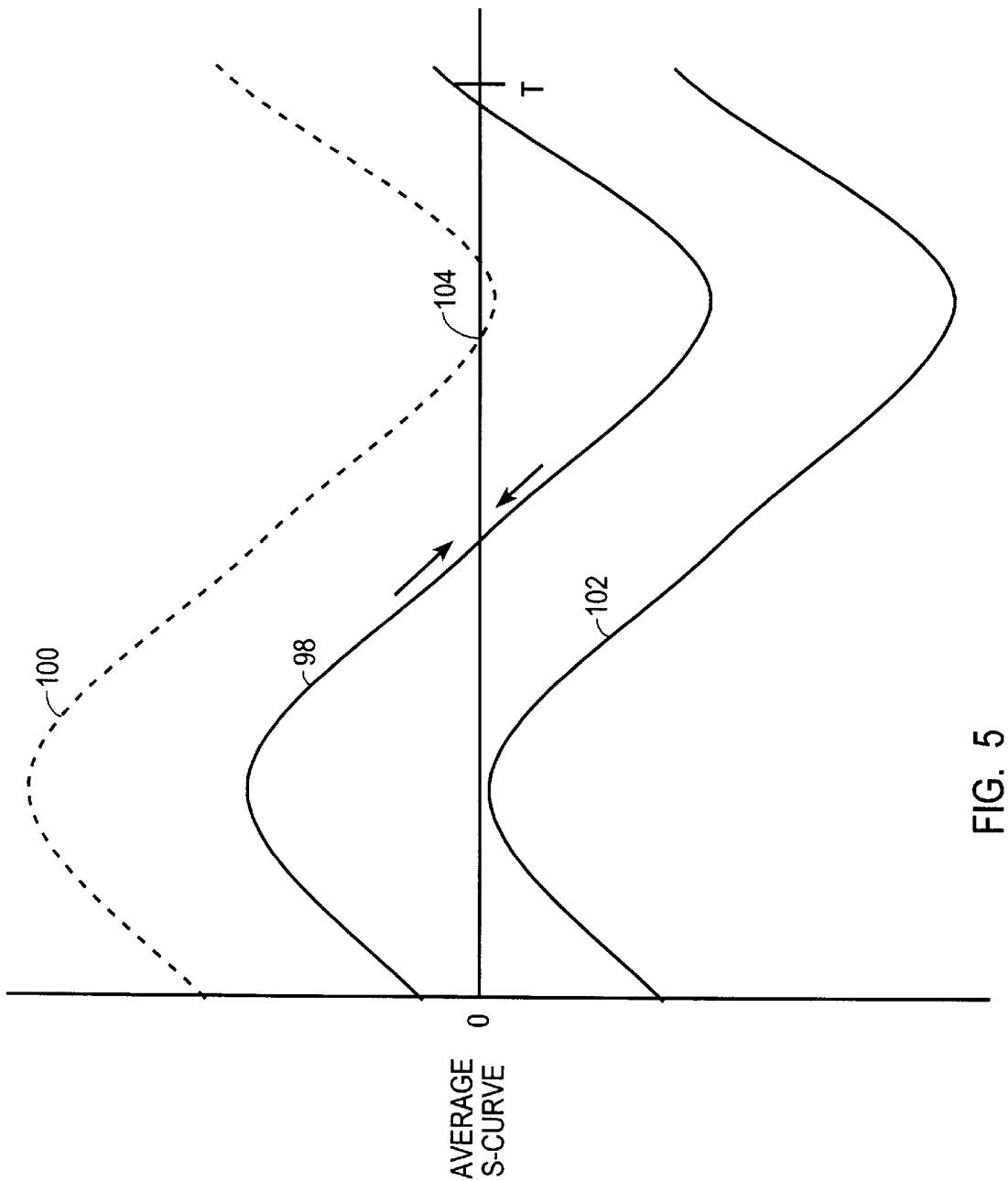
FIG. 5 shows exemplary S-curves achieved by a phase locked loop used for symbol synchronization in the digital communication receiver.

FIG. 5 shows exemplary S-curves achieved by PLL 54. The S-curves depict average phase error estimate output exhibited by phase error estimate signal 82 on the vertical axis when sampling instants vary over the duration of a symbol interval, as indicated by the horizontal axis. A central S-curve 98 represents an ideal S-curve because this S-curve exhibits one polarity during the first portion of a symbol interval and an opposite polarity during the remainder of the symbol interval. Consequently, PLL 54 drives symbol timing to the point where S-curve 98 equals zero, which point occurs roughly in the middle of the symbol interval. Moreover, since significant portions of S-curve 98 reside on either side of this zero point, a significant perturbation in either direction can be experienced with PLL 54 simply driving itself back to the zero point after the perturbation. Accordingly, S-curve 98 represents a robust phase locked loop.

S-curve 98 describes the performance of PLL 54 during a majority of situations when adjusting signal 80 exhibits a value of around zero. However, in applications where received analog signal 12 (FIG. 1) experiences significant distortion, such as occurs in the presence of multipath, S-curves resembling those of exemplary S-curves 100 or 102 may result when adjusting signal 80 exhibits a value of zero. When distortion causes PLL 54 to behave in accordance with S-curve 100, a locked condition can be achieved because S-curve 100 has a zero-crossing point 104. However, unreliable performance may result because zero-crossing point 104 occurs far from the middle of the symbol interval and because a slight perturbation may cause PLL 54 to lose lock. When distortion causes PLL 54 to behave in accordance with S-curve 102, a locked condition cannot be achieved because no zero-crossing point exists.

Accordingly, phase error offset generator 52 (FIG. 1) is configured to supply adjusting signal 80 as an S-curve offset which causes the S-curve of PLL 54 to more closely resemble S-curve 98 than S-curves 100 or 102, regardless of distortion that analog input signal 12 may experience.

Figure 6:
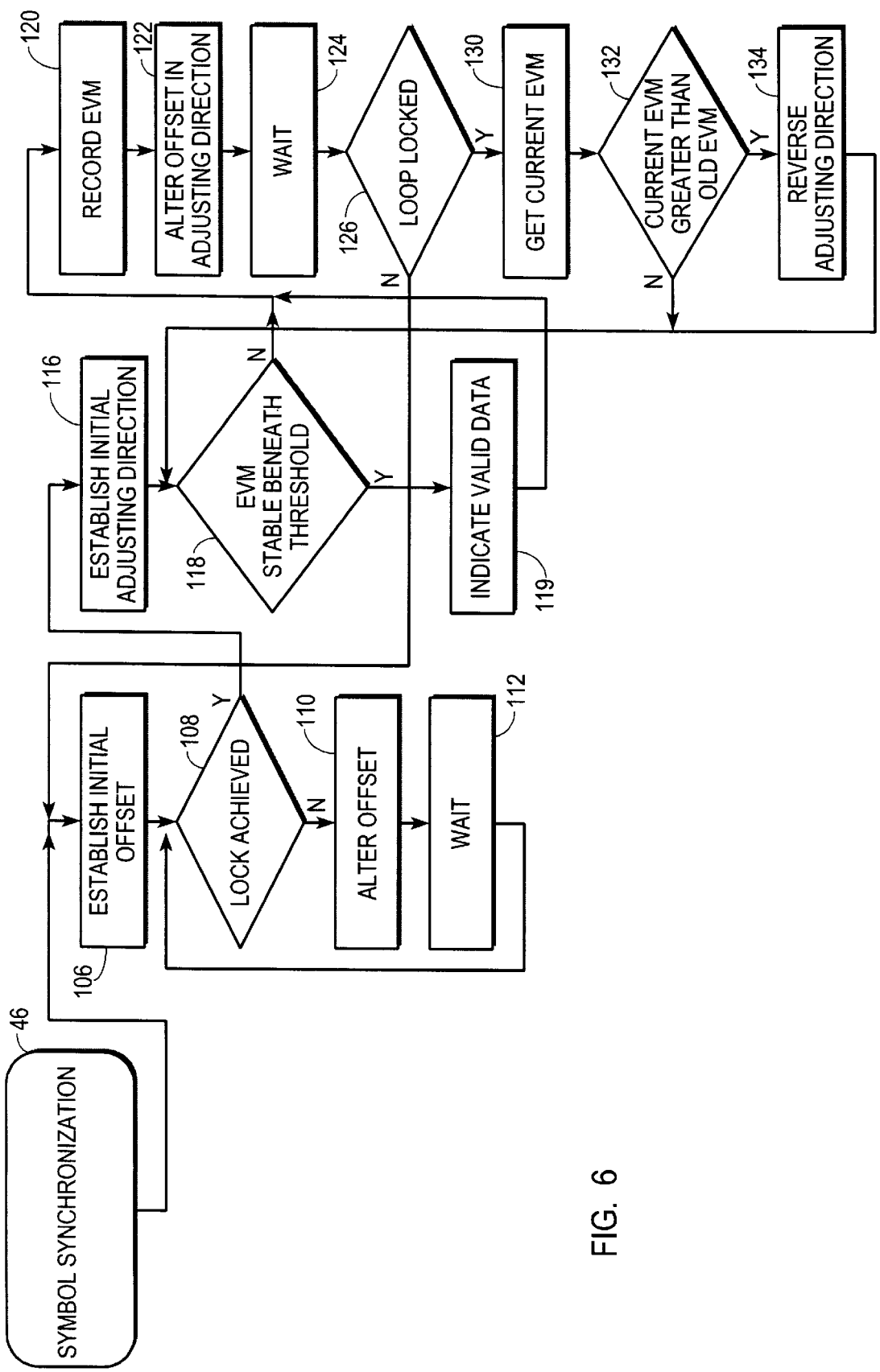
FIG. 6 shows a flow chart of a symbol synchronization process followed by a first embodiment of the digital communication receiver.

FIG. 6 shows a flow chart of a process 46 performed by the first embodiment of digital communication receiver 10 to achieve symbol synchronization. Referring to FIGS. 1 and 6, process 46 relies upon signals from lock detector 60 and error vector magnitude generator 40 to progress through its tasks.

In this first embodiment, phase error offset generator 52 is configured as a programmable controller, such as a microprocessor, memory and related peripheral circuits known to those skilled in the art. Offset generator 52 (FIG. 1) is configured to perform a variety of tasks which appropriately configure adjusting signal 80 (FIG. 1).

Offset generator 52 performs a task 106 to establish an initial offset value. In other words, adjusting signal 80 is set at some initial constant value, which may be a value of zero, a maximum negative value, a maximum positive value, or the like. Following task 106, a query task 108 determines whether PLL 54 has achieved a locked condition by monitoring the output from lock detector 60. So long as PLL 54 is not yet in a locked condition, a task 110 is performed to alter the currently existing offset value of adjusting signal 80. For example, if the initial offset value established above in task 106 was a maximum negative value, then task 110 may alter this offset value a relatively large step in the positive direction. Following task 110, a task 112 causes program control to wait before returning to task 108.

Wait task 112 is performed to allow time for the effects of the alteration of task 110 to have an influence in PLL 54 and for that influence to stabilize. Referring to FIG. 1, an adjustment feedback loop 114, which includes lock detector 60, symbol synchronizer 38 and offset generator 52, exhibits a response time significantly slower than the response time exhibited by PLL 54 due to the operation of task 112.

Referring back to FIG. 3, program control remains in the programming loop that includes tasks 108, 110 and 112 until task 108 determines that PLL 54 has achieved a locked condition. When lock is detected, a task 116 then establishes an initial adjusting direction. This adjusting direction indicates whether the next alteration to the value exhibited by adjusting signal 80 will be in the positive or negative direction. Either direction may suffice at task 116.

Following task 116, an optional query task 118 evaluates error vector magnitude (EVM) signal 62 (FIG. 1) to determine whether it is exhibiting a stable value, the absolute value of which is less than a predetermined threshold. The precise threshold value and the filtering criteria used to determine stability are not critical parameters. If task 118 finds that error vector magnitude signal 62 exhibits a small, stable value, then PLL 54 has acquired symbol timing. Accordingly, an optional task 119 may be performed when signal 62 exhibits a small, stable value to appropriately indicate that symbol timing has been acquired and that valid data should be available from data detector 42 (FIG. 1).

When task 118 determines that error vector magnitude signal 62 does not yet exhibit a sufficiently small and stable value, a task 120 records the value then exhibited by error vector magnitude signal 62 for later comparison purposes. Next, a task 122 alters adjusting signal 80 in the adjusting direction. Desirably, task 122 makes an alteration in the form of a relatively small step which either increases or decreases the value then exhibited by adjusting signal 80. After task 122, a task 124 causes program control to wait before continuing to a query task 126.

Wait task 124 is performed to allow time for the effects of the alteration of task 122 to have an influence in PLL 54 and for that influence to stabilize. Referring briefly to FIG. 1, an adjustment feedback loop 128, which includes error vector magnitude generator 40, offset generator 52, symbol synchronizer 38, loop filter 50, clock generator 24, and digital converter 20 exhibits a response time significantly slower than the response time exhibited by PLL 54 due to the operation of task 124.

Query task 126 verifies that PLL 54 remains in the locked condition. If PLL 54 has lost lock, then program control returns to task 106, discussed above, to again adjust input signal 80 until PLL 54 locks.

When task 126 determines that PLL 54 is still locked, a task 130 obtains the then-current value exhibited by error vector magnitude signal 62, and a query task 132 compares this current value to the past error vector magnitude value saved above during task 120. So long as the current value is less than or equal to the old value, program control simply returns to task 118. When the current value is greater than the old value, a task 134 reverses the adjusting direction, discussed above in connection with tasks 116 and 122, and program control passes back to task 118.

When task 118 eventually determines that error vector magnitude signal 62 exhibits a sufficiently small and stable value, the S-curve which characterizes phase error estimate signal 82 (FIG. 1) output from summing circuit 44 more closely resembles S-curve 98 than S-curves 100 or 102 (FIG. 6), even though phase error estimate signal 82 may resemble S-curves 100 or 102 due to the presence of distortion in analog input signal 12. PLL 54 has achieved a locked condition and has been further adjusted so that reliable operation results.

While the first embodiment of receiver 10 described above works well for many applications, the amount of time needed to acquire symbol timing may be unacceptably long for other applications. Accordingly, a second embodiment of receiver 10 may be configured as illustrated in FIG. 7.

Figure 7:
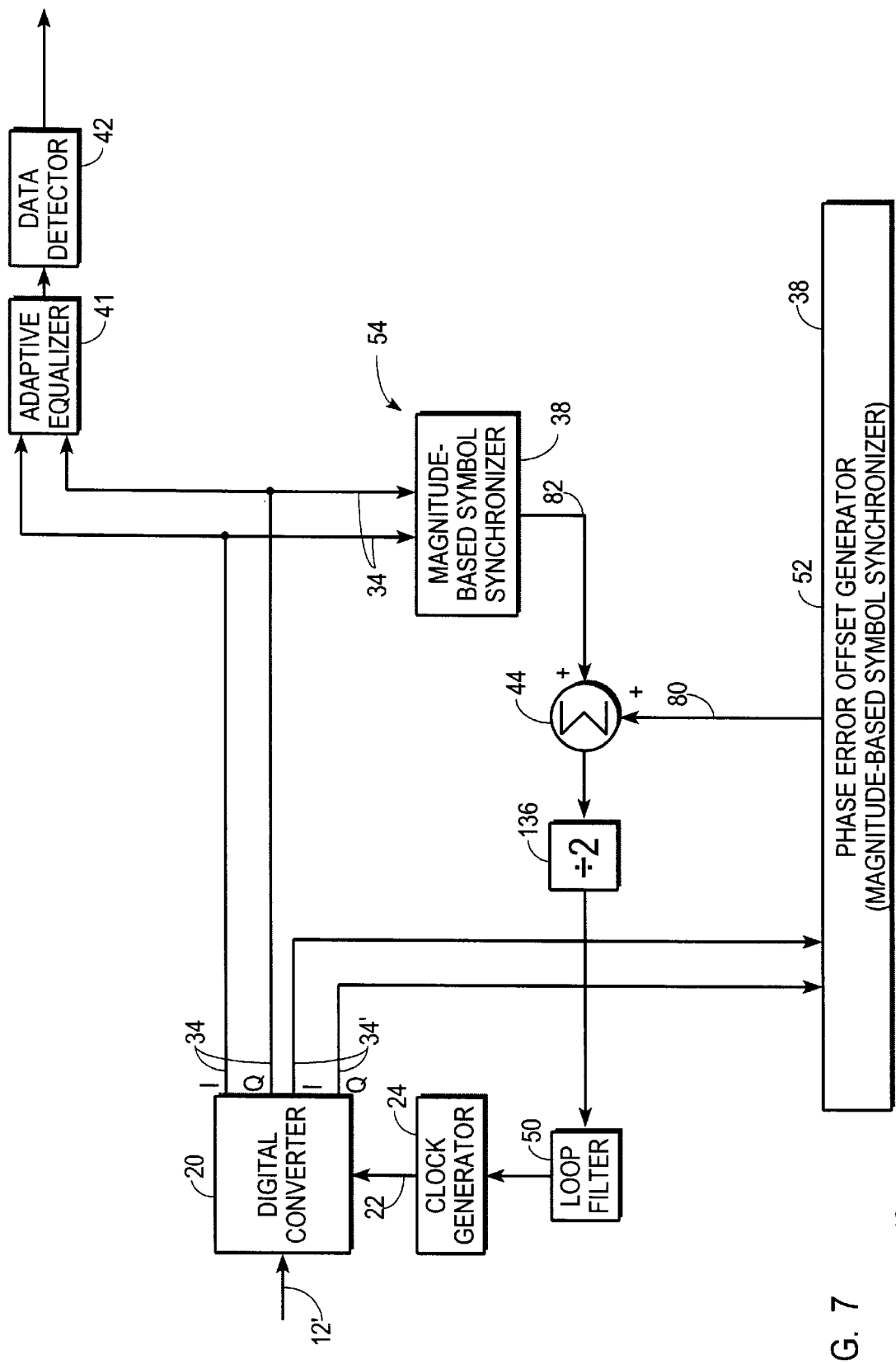
FIG. 7 shows a block diagram of a second embodiment of the digital communication receiver.

In comparing the first embodiment of FIG. 1 with the second embodiment of FIG. 7, circuits located upstream from digital converter 20 are used but not illustrated in FIG. 7 for clarity. Moreover, lock detector 60 and error vector magnitude generator 40 (FIG. 1) may be omitted from the second embodiment of FIG. 7.

As discussed above, digital converter 20 provides two complex data streams, labeled streams 34 and 34', with each stream 34 preferably conveying less than two samples per symbol interval. As discussed above in connection with FIG. 2, second stream 34' provides complex samples which represent analog signal 12 at instants delayed approximately one-half a symbol interval from the samples in first stream 34. Second stream 34' is routed to phase error offset generator 52.

A divide-by-two block 136 is shown in FIG. 7 inserted between the output of summing circuit 44 and the input of loop filter 50. However, those skilled in the art will appreciate that clock generator 24 or other components in PLL 54 may be easily adjusted to reduce gain by a factor of two without using a dedicated divide-by-two block.

Accordingly, the second embodiment of FIG. 7 closely resembles the first embodiment of FIG. 1. However, in the second embodiment, phase error offset generator 52 generates adjusting signal 80 in response to second complex data stream 34' rather than in response to the lock detection and error vector magnitude signals used in the first embodiment.

In this second embodiment, phase error offset generator 52 may be configured identically to magnitude based symbol synchronizer 38, details of which are shown in FIG. 4, were discussed above, and apply to phase error offset generator 52 in the manner discussed above except for operating on a different stream of data. Accordingly, in this second embodiment, receiver 10 includes two magnitude-based symbol synchronizers 38, each of which includes a phase processor 78 and a magnitude processor 76. One of the two symbol synchronizers 38 operates on samples which represent analog signal 12 at instants occurring a predetermined duration, for example one-half a symbol interval, after the samples on which the other symbol synchronizer 38 operates.

In this second embodiment, adjusting signal 80 also represents a phase error estimate signal which may be characterized by an S-curve. By observing the S-curves in FIG. 5, one may note that for ideal curve 98 the S-curve values at points spaced a distance of T/2 apart have approximately equal magnitude but opposite polarity. However, for S-curves 100 and 102, points spaced a distance of T/2 apart are offset vertically by a distance roughly equal to twice the vertical displacement needed to cause S-curves 100 and 102 to resemble ideal S-curve 98. Accordingly, this second embodiment of receiver 10 exploits this phenomenon.

Accordingly, an offset error estimate signal generated by summing circuit 44 equals phase error estimate signal 82 plus one-half the difference between delayed phase error estimate signal 80 and phase error estimate signal 82, which is equivalent to one-half the sum of phase error estimate signal 82 and delayed phase error estimate signal 80. Thus, the offset error estimate signal generated by summing circuit 44 provides an S-curve which more closely resembles ideal S-curve 98 than S-curves 100 or 102. Consequently, even in the presence of significant signal distortion PLL 54 can achieve a locked condition and demonstrate robust operation.

In summary, the present invention provides an improved symbol synchronizer and method which recover symbol timing based on adjusted, phase-selected magnitude values. The present invention exhibits robust performance even in the presence of significant received signal distortion through the operation of adjusting signal 80 and summation circuit 44. Since the present invention may be used with fewer than two samples per symbol, receiver 10 may operate at a symbol rate nearly equal to the maximum speed supported by the semiconductor technology, such as CMOS, within which it is implemented. A non-data-directed symbol synchronization process implemented by PLL 54 does not require a-priori recovery of valid data. Accordingly, symbol synchronization works independently of adaptive equalization and does not require lengthy bootstrapping processes.

Although the preferred embodiments of the present invention have been illustrated and described in detail, it will be readily apparent to those skilled in the art that various modifications and equivalents may be made therein without departing from the spirit of the invention or from the scope of the appended claims. For example, in one alternate embodiment, adjusting signal 80 may be used to adjust the inter-symbol delay implemented by interpolator 90 rather than or in addition to the resulting phase error estimate signal as described above. In another version of the first embodiment discussed herein, another indicator of signal quality, such as a bit error rate indicator provided by a block decoding function, may be used to further refine the value of adjusting signal 80 in process 46. In still other alternate embodiments, different algorithms from those described herein are used to alter adjusting signal 80 to achieve convergence toward S-curve 98. These and other equivalent modifications which are intended to be included within the scope of the present invention.

What is claimed is:

1. A symbol synchronizer for recovering symbol timing in a digital communication receiver which receives an analog signal configured as a stream of symbols from a channel which distorts said analog signal, said symbol synchronizer comprising:

a clock generator for generating a clock signal that defines symbol timing;

a converter, coupled to said clock generator, for converting said analog signal into a complex digital data stream having a complex sample for each symbol interval;

a phase processor, coupled to said converter, for identifying clock adjustment opportunities in response to phase relationships exhibited by said complex samples;

a magnitude processor, coupled to said converter, said phase processor and said clock generator, for generating a phase error estimate signal that adjusts said symbol timing defined by said clock signal in response to magnitude relationships exhibited by said complex samples, said phase error estimate signal being updated in synchronism with said identified clock adjustment opportunities; and a phase error offset generator, coupled to said magnitude processor, for adjusting said phase error estimate signal to cause a phase locked loop which includes said clock generator, said converter and said magnitude processor to achieve a locked condition in the presence of distortion in said analog signal.

2. A symbol synchronizer as claimed in claim 1 wherein:

said symbol synchronizer additionally comprises a lock detector coupled between said phase locked loop and said phase error offset generator, said lock detector being configured to determine whether said phase locked loop has achieved a locked condition; and said phase error offset generator is configured so that said phase error estimate signal is adjusted in response to whether said phase locked loop has achieved said locked condition.

3. A symbol synchronizer as claimed in claim 2 wherein:

said symbol synchronizer additionally comprises an error vector magnitude generator which generates an error vector magnitude signal, said error vector magnitude generator being coupled to said converter and to said phase error offset generator; and said phase error offset generator is further configured so that said phase error estimate signal is additionally adjusted in response to said error vector magnitude signal.

4. A symbol synchronizer as claimed in claim 3 wherein said phase error offset generator is further configured so that said phase error estimate signal is adjusted first in response to whether said phase locked loop has achieved said locked condition then second in response to said error vector magnitude signal after said locked condition occurs.

5. A symbol synchronizer as claimed in claim 1 additionally comprising a summation circuit having an output which provides an offset error estimate signal, a first input coupled to said phase error offset generator and a second input coupled to said magnitude processor.

6. A symbol synchronizer as claimed in claim 5 wherein said phase processor is a first phase processor, said magnitude processor is a first magnitude processor, and said phase error offset generator comprises:

a second phase processor coupled to said converter; and a second magnitude processor coupled to said converter and to said first phase processor.

7. A symbol synchronizer as claimed in claim 6 wherein:

said complex digital data stream is a first complex digital data stream; and said converter additionally converts said analog signal into a second complex digital data stream having a complex sample for each symbol interval, said samples in said second stream representing said analog signal at instants delayed by a fraction of a symbol interval from instants represented by said first stream.

8. A symbol synchronizer as claimed in claim 7 wherein:

said phase error estimate signal generated by said first magnitude processor is a first phase error estimate signal; and said second magnitude processor is configured to generate a second phase error estimate signal that is responsive to magnitude relationships exhibited by said second complex digital data stream, said second phase error estimate signal being updated in synchronism with clock adjustment opportunities identified by said second phase processor.

9. A symbol synchronizer as claimed in claim 1 wherein:

said phase locked loop is a first feedback loop having a first response time;

said controller couples to said magnitude processor to complete a second feedback loop having a second response time; and said first response time is faster than said second response time.

10. A symbol synchronizer as claimed in claim 1 wherein said magnitude processor is configured so that said magnitude relationships exhibited by said complex samples approximately coincident with said clock adjustment opportunities influence said phase error estimate signal.

11. In a digital communication receiver, a method of recovering symbol timing from an analog signal received from a channel which distorts said analog signal, said method comprising:

generating, within a phase locked loop, a clock signal which defines symbol timing;

converting, within said phase locked loop, said analog signal into a complex digital data stream having a complex sample for each symbol interval;

separating, within said phase locked loop, magnitude attributes of said complex samples for each symbol interval from phase attributes of said complex samples so that said magnitude attributes are substantially insensitive to phase changes;

identifying clock adjustment opportunities in response to said complex samples;

generating, within said phase locked loop, a phase error estimate signal that adjusts said symbol timing defined by said clock signal in response to said separated magnitude attributes of said complex samples, said phase error estimate signal being updated in synchronism with said identified clock adjustment opportunities; and adjusting said phase error estimate signal to cause said phase locked loop to achieve a locked condition in the presence of distortion in said analog signal.

12. A method as claimed in claim 11 wherein:

said method additionally comprises determining whether said phase locked loop has achieved a locked condition; and said adjusting operation offsets said phase error estimate signal in response to said determining operation.

13. A method as claimed in claim 11 wherein:

said method additionally comprises producing an error vector magnitude signal from said complex samples; and said adjusting operation offsets said phase error estimate signal in response to said producing operation.

14. A method as claimed in claim 13 wherein said adjusting operation comprises:

initially offsetting said phase error estimate signal in response to whether said phase locked loop has achieved said locked condition; and then offsetting said phase error estimate signal in response to said error vector magnitude signal after said locked condition occurs.

15. A method as claimed in claim 11 wherein:

said phase error estimate signal is generated in response to said magnitude attributes of said complex samples, wherein said phase error estimate signal is updated in synchronism with said identified clock adjustment opportunities; and said adjusting operation generates an offset phase error estimate signal by adding an offset to said phase error estimate signal.

16. A method as claimed in claim 15 wherein said complex digital data stream is a first complex digital data stream, said phase error estimate signal is a first phase error estimate signal, said identified clock adjustment opportunities are first identified clock adjustment opportunities, and said adjusting operation comprises:

converting said analog signal into a second complex digital data stream having a complex sample for each symbol interval;

separating magnitude attributes of said second stream samples from phase attributes of said second stream samples so that said magnitude attributes are substantially insensitive to phase changes;

identifying second clock adjustment opportunities in response to said second stream samples; and generating a second phase error estimate signal in response to said separated magnitude attributes of said second stream, said second phase error estimate signal being updated in synchronism with said second identified clock adjustment opportunities.

17. A method as claimed in claim 16 wherein said second stream converting operation causes said samples in said second stream to represent said analog signal at instants delayed by a fraction of a symbol interval from instants represented by said first stream.

18. A method as claimed in claim 11 wherein:

said identifying operation determines changes occurring in said phase attributes; and said clock adjustment opportunities are identified in response to said changes in said phase attributes.

19. A method as claimed in claim 18 wherein said identifying operation further comprises:

defining occurrences of relatively larger phase change as being clock adjustment opportunities; and defining occurrences of relatively smaller phase change as not being clock adjustment opportunities.

20. A symbol synchronizer for recovering symbol timing in a digital communication receiver which receives an analog signal configured as a stream of symbols from a channel which distorts said analog signal, said symbol synchronizer comprising:

a clock generator for generating a clock signal that defines symbol timing;

a converter, coupled to said clock generator, for converting said analog signal into first and second complex digital data streams, said second stream having samples representing said analog signal at instants delayed by a fraction of a symbol interval from instants represented by samples of said first stream;

a first phase processor coupled to said converter, for identifying first clock adjustment opportunities in response to phase relationships exhibited by said first stream samples;

a first magnitude processor, coupled to said converter and said first phase processor, for generating a first phase error estimate signal in response to magnitude relationships exhibited by said first stream samples, said first phase error estimate signal being updated in synchronism with said first identified clock adjustment opportunities;

a second phase processor coupled to said converter, for identifying second clock adjustment opportunities in response to phase relationships exhibited by said second stream samples;

a second magnitude processor coupled to said converter and said second phase processor, for generating a second phase error estimate signal in response to magnitude relationships exhibited by said second stream samples, said second phase error estimate signal being updated in synchronism with said second identified clock adjustment opportunities; and a summation circuit having an output coupled to said clock generator, a first input adapted to receive said first phase error estimate signal and a second input adapted to receive said second phase error estimate signal.

* * * * *